ас

US009214498B2

(12) United States Patent
Yun et al.

(10) Patent No.: US 9,214,498 B2
(45) Date of Patent: Dec. 15, 2015

(54) ORGANIC LIGHT EMITTING DISPLAY DEVICE AND DRIVING METHOD OF THE SAME

(71) Applicant: LG DISPLAY CO., LTD., Seoul (KR)

(72) Inventors: Soonil Yun, Paju-si (KR); Sungjin Hong, Goyang-si (KR); Incheol Park, Paju-si (KR); Dongho Lee, Pyeongtaek-si (KR); Younghee Lee, Yongin-si (KR)

(73) Assignee: LG Display Co., Ltd., Seoul (KR)

( * ) Notice: Subject to any disclaimer, the term of this patent is extended or adjusted under 35 U.S.C. 154(b) by 267 days.

(21) Appl. No.: 13/729,788

(22) Filed: Dec. 28, 2012

(65) Prior Publication Data
US 2013/0168655 A1 Jul. 4, 2013

Related U.S. Application Data

(63) Continuation-in-part of application No. 12/806,010, filed on Aug. 4, 2010, now Pat. No. 8,347,530.

(60) Provisional application No. 61/273,547, filed on Aug. 5, 2009.

(30) Foreign Application Priority Data

Sep. 26, 2012 (KR) .................. 10-2012-0107268
Nov. 20, 2012 (KR) .................. 10-2012-0131456

(51) Int. Cl.
H01L 51/00 (2006.01)
H01L 27/32 (2006.01)

(52) U.S. Cl.
CPC .......... H01L 27/3213 (2013.01); H01L 27/322 (2013.01); H01L 27/3216 (2013.01); H01L 51/0001 (2013.01); H01L 27/326 (2013.01); H01L 27/3246 (2013.01); H01L 27/3258 (2013.01); H01L 27/3276 (2013.01); H01L 2251/5392 (2013.01)

(58) Field of Classification Search
CPC .................................................. H01L 27/3213
USPC ......................................................... 257/40
See application file for complete search history.

(56) References Cited

U.S. PATENT DOCUMENTS 6,969,889 B2 * 11/2005 Cho et al. ...................... 257/347
7,622,200 B2   11/2009 Ohsawa et al.
(Continued)

FOREIGN PATENT DOCUMENTS

CN     1551383 A    12/2004
CN     1819300 A     8/2006
(Continued)

OTHER PUBLICATIONS

Office Action issued in corresponding German Patent Application No. 102012024538.6, dated Jul. 22, 2013, 12 pages.
Office Action issued in Korean Patent Application No. 10-2012-0131456, mailed Jun. 19, 2014, 6 pages.
Office Action dated Sep. 6, 2015 for corresponding Chinese Patent Application No, 201210564714.6, 19 pages.

Primary Examiner — Earl Taylor
Assistant Examiner — Sitaramarao S Yechuri
(74) Attorney, Agent, or Firm — Brinks Gilson & Lione

(57) ABSTRACT

An organic light emitting display device comprises: a lower substrate; a underlying wire formed on the lower substrate; and red, green, and blue subpixels each comprising a transistor section formed on the lower substrate and an organic light emitting diode, wherein the white subpixel comprises a first electrode which is non-overlapped with the underlying wire and is spaced apart from the underlying wire.

21 Claims, 11 Drawing Sheets

(56) References Cited

U.S. PATENT DOCUMENTS

| | | | |
|---|---|---|---|
| 2004/0217694 A1* | 11/2004 | Cok et al. | 313/504 |
| 2009/0251051 A1* | 10/2009 | Hwang et al. | 313/504 |
| 2009/0261712 A1* | 10/2009 | Choi et al. | 313/504 |
| 2010/0012928 A1* | 1/2010 | Lee et al. | 257/40 |

FOREIGN PATENT DOCUMENTS

| | | |
|---|---|---|
| JP | 2006114493 A | 4/2006 |
| KR | 20110094456 A | 8/2011 |
| KR | 20120042433 A | 5/2012 |
| WO | WO 2007/050113 A1 | 5/2007 |

\* cited by examiner

ORGANIC LIGHT EMITTING DISPLAY DEVICE AND DRIVING METHOD OF THE SAME

This application claims the benefit of Korean Patent Application Nos. 10-2012-0107268 filed on Sep. 26, 2012 and 10-2012-0131456 filed on Nov. 20, 2012, which are hereby incorporated by reference in their entireties.

BACKGROUND

1. Field

This document relates to an organic light emitting display device and a method for manufacturing the same.

2. Related Art

An organic light emitting element used for an organic light emitting display device is a self-luminous element in which an emission layer is formed between two electrodes. The organic light emitting element is an element that emits light when electrons and holes are injected from an electron injection electrode (cathode) and a hole injection electrode (anode) to an emission layer and excitons created by recombination of the injected electrons and holes transition from an excited state to a base state.

In the organic light emitting display device, when a scan signal, a data signal, and electric power are supplied to a plurality of subpixels disposed in a matrix form, transistors, etc included in a selected subpixel are driven. Hereupon, an organic light emitting diode emits light in response to the current formed therein to display an image.

Some organic light emitting display devices are implemented as an organic light emitting display (hereinafter, referred to RGBW OLED) having a subpixel structure of red, green, blue, and white to increase light efficiency and prevent degradations in the luminance and chromaticity of pure colors.

The RGBW OLED implements RGBW by using a white organic light emitting diode for emitting white light and color filters for converting the white light into red light, green light, and blue light. In this structure, a white subpixel comprises no color filter because it emits white light as it is. Due to this, a white organic light emitting diode formation layer of the white subpixel is lower than those of red, green, and blue subpixels. Thus, the vertical distance between an underlying wire and a first electrode of the white organic light emitting diode is short. That is, the white subpixel has a smaller step difference than the other subpixels.

For this reason, when the pattern (e.g., insulating film, electrode, etc) of the conventional RGBW OLED is lost due to impurities (e.g., particles) introduced during a process, such as photolithography, etching, cleaning, etc, short-circuiting or overcurrent occurs between the underlying wire and the first electrode included in the white subpixel. Partial burning of the device due to such short-circuiting or overcurrent between different electrodes may spread across the entire panel, so a solution to this problem is required.

SUMMARY

An organic light emitting display device comprises: a lower substrate; a underlying wire on the lower substrate; and red, green, and blue subpixels each comprising a transistor section on the lower substrate and an organic light emitting diode, wherein the white subpixel comprises a first electrode, which is non-overlapped with the underlying wire and is spaced apart from the underlying wire.

In another aspect, an exemplary embodiment of the present invention provides an organic light emitting display device comprising: a lower substrate; a underlying wire on the lower substrate; and red, green, and blue subpixels each comprising a transistor section on the lower substrate and an organic light emitting diode, wherein an insulating film contacting the bottom of the first electrode of the white subpixel comprises an unexposed area and an exposed area.

In still another aspect, an exemplary embodiment of the present invention provides a method for manufacturing an organic light emitting display device comprising: a lower substrate; a underlying wire formed on the lower substrate; and red, green, and blue subpixels each comprising a transistor section formed on the lower substrate and an organic light emitting diode, the method comprising: forming a first electrode of the white subpixel on the insulating film, wherein the first electrode is non-overlapped with the underlying wire and is spaced apart from the underlying wire; forming a bank layer defining an opening on the insulating film; forming an organic emission layer on the first electrode; and forming a second electrode on the organic emission layer.

In a further aspect, an exemplary embodiment of the present invention provides a method for manufacturing an organic light emitting display device comprising: a lower substrate; an underlying wire formed on the lower substrate; and red, green, and blue subpixels each comprising a transistor section formed on the lower substrate and an organic light emitting diode, the method comprising: forming a first electrode of the white subpixel on the insulating film; forming a bank layer defining an opening on the insulating film; forming an organic emission layer on the first electrode; and forming a second electrode on the organic emission layer, wherein the insulating film positioned below the first electrode comprises a non-exposed area and an exposed area.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION

Reference will now be made in detail to the embodiments of the present invention, examples of which are illustrated in the accompanying drawings.

Hereinafter, concrete embodiments of the present invention will be described with reference to the accompanying drawings.

First Exemplary Embodiment

Figure 1:
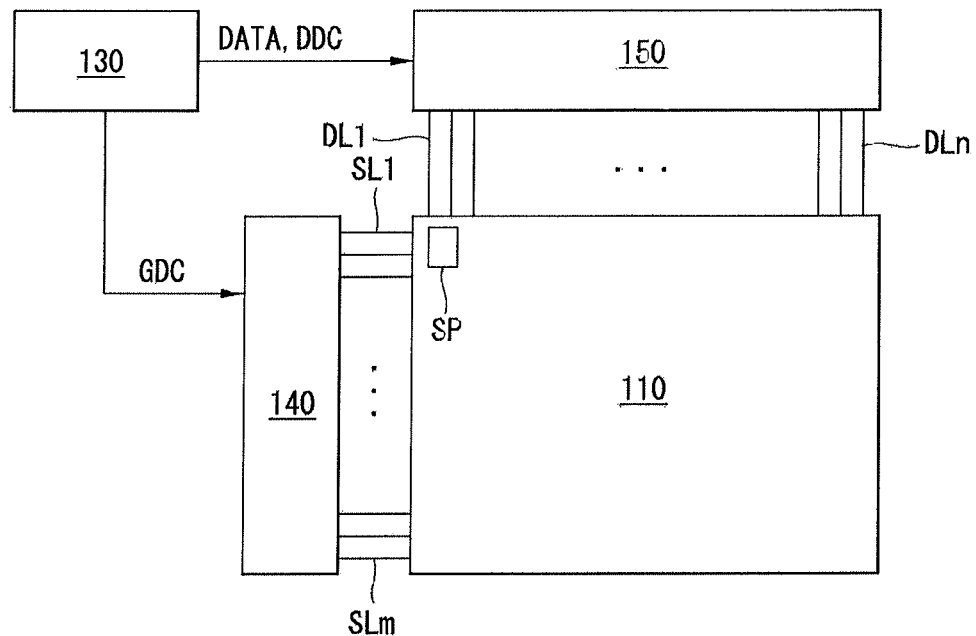
FIG. 1 is a schematic view of the configuration of an organic light emitting display device according to a first exemplary embodiment of the present invention.
Figure 2:
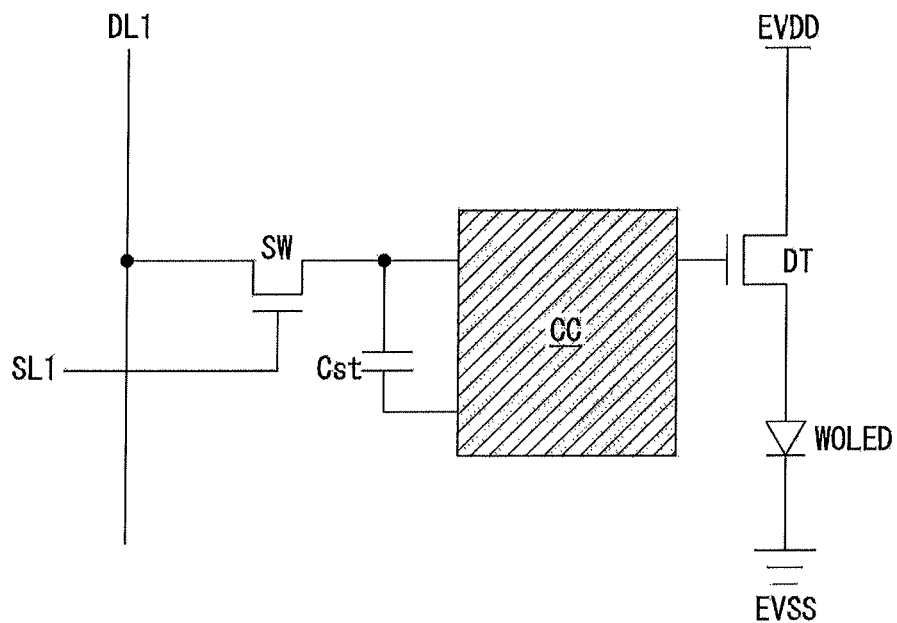
FIG. 2 is an illustration of the circuit configuration of a subpixel.
Figure 3:
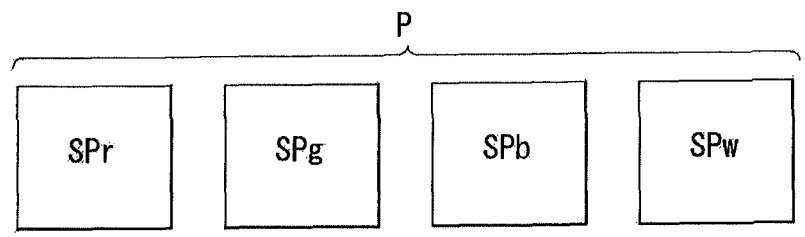
FIG. 3 is a view for explaining the configuration of a pixel.
Figure 4:
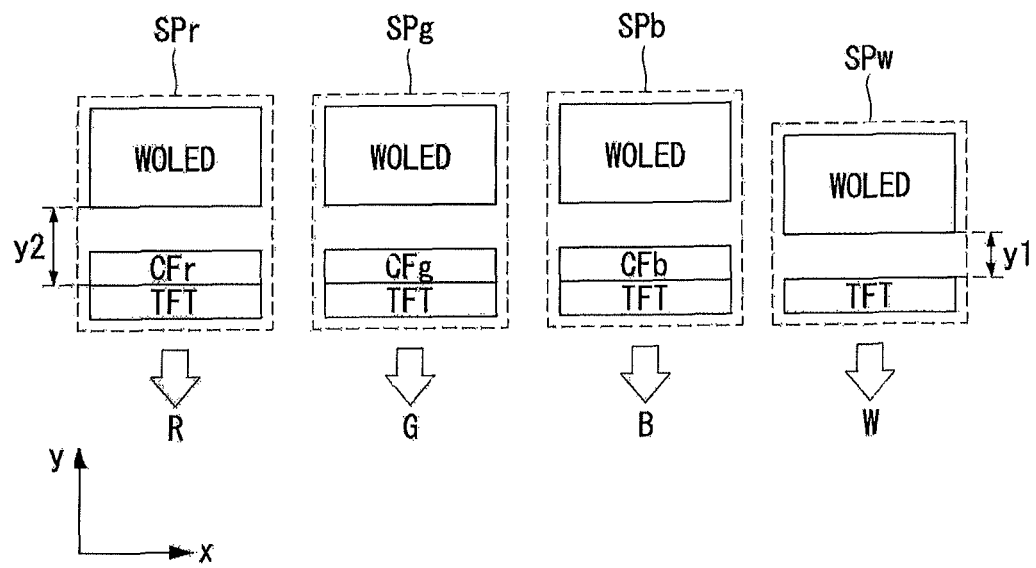
FIG. 4 is a schematic cross-sectional layer diagram of a subpixel.

FIG. 1 is a schematic view of the configuration of an organic light emitting display device according to a first exemplary embodiment of the present invention. FIG. 2 is an illustration of the circuit configuration of a subpixel. FIG. 3 is a view for explaining the configuration of a pixel. FIG. 4 is a schematic cross-sectional layer diagram of a subpixel.

As shown in FIG. 1, the organic light emitting display device according to the first exemplary embodiment of the present invention comprises a timing controller 130, a data driver 150, a scan driver 140, and a panel 110.

The timing controller 130 controls the operation timings of the data driver 150 and the scan driver 140 by using timing signals such as a vertical synchronous signal Vsync, a horizontal synchronous signal Hsync, a data enable signal DE, and a clock signal CLK. Since the timing controller 130 can determine a frame period by counting data enable signals of 1 horizontal period, the vertical synchronization signal Vsync and the horizontal synchronization signal Hsync supplied from the outside can be omitted. Control signals generated from the timing controller 130 include a gate timing control signal GDC for controlling the operation timing of the scan driver 140 and a data timing control signal for controlling the operation timing of the data driver 150. The gate timing control signals GDC comprise a gate start pulse, a gate shift clock signal, a gate output enable signal, etc. The data timing control signals comprise a source start pulse, a source sampling clock, a polarity control signal, a source output enable signal, etc.

The scan driver 140 sequentially generates scan signals while shifting the level of a gate driving voltage in response to a gate timing control signal GDC supplied from the timing controller 130. The scan driver 140 supplies scan signals through scan lines SL1 to SLm connected to subpixels SP included in the panel 100.

The data driver samples and latches a data signal DATA supplied from the timing controller 130 in response to a data timing control signal DDC supplied from the timing controller 130, and converts it into a data signal having a parallel data format. The data driver 150 converts the data signal DATA into a gamma reference signal. The data driver 150 supplies the data signal DATA to data lines DL1 to DLn connected to the subpixels SP included in the panel 110.

The panel 110 comprises the subpixels SP disposed in a matrix form between two substrates (or films). The subpixels SP may be of a top-emission type, a bottom-emission type or a dual emission type according to their structure. The subpixels SP included in the panel 110 may be configured in a 2T1C (2 transistors and 1 capacitor) structure comprising a switching transistor, a driving transistor, a capacitor and an organic light emitting diode or in a 3T1C, 4T2C, 5T2C, or 6T2C structure further comprising a compensation circuit.

With the compensation circuit added as shown in FIG. 2, the subpixels included in the panel 110 have the following structure. One subpixel comprises a switching transistor SW, a driving transistor DR, a capacitor Cst, a compensation circuit CC, and an organic light emitting diode WOLED.

The switching transistor SW performs a switching operation in response to a scan signal supplied through a first scan line SL1 to store a data signal supplied through a first data line SL1 as a data voltage in the capacitor Cst. The driving transistor DR is driven depending on to allow driving current corresponding to the data voltage stored in the capacitor Cst to flow between a high-potential power line EVDD for supplying high-potential power and a low-potential power line EVSS for supplying low-potential power. The organic light emitting diode WOLED is driven to emit light according to the driving current generated by the driving transistor DR.

The compensation circuit CC compensates for a threshold voltage of the driving transistor DR. For example, the compensation circuit CC has a diode connection configuration or source-follower configuration to compensate for the threshold voltage of the driving transistor DR. To this end, the compensation circuit CC consists of one or more transistors and a capacitor. An initialization voltage, a reference voltage, or an auxiliary voltage is further supplied to a specific node of the compensation circuit CC. The configuration of the compensation circuit CC is varied in many ways, so detailed illustration and explanation thereof are omitted.

As shown in FIG. 3, the subpixels SP included in the panel 110 comprise a red subpixel SPr, a green subpixel SPg, a blue subpixel SPb, and a white subpixel SPw. The red subpixel SPr, green subpixel SPg, blue subpixel SPb, and white subpixel SPw constitute one pixel P. Although the subpixels are illustrated as being arranged in the order of r, g, b, and w, the arrangement order thereof may be varied depending on desired color format, such as wrgb, rwgb, rgwb, etc, or depending on desired structure. To increase light efficiency and prevent degradations in the luminance and chromaticity of pure colors, the above structure further comprises the white subpixel, in addition to the red, green, and blue subpixels.

As shown in FIG. 4, the red subpixel SPr, green subpixel SPg, blue subpixel SPb, and white subpixel SPw convert white light emitted from the white organic light emitting diode WOLED by RGB color filters CFr, CFg, and CFb to realize RGB.

On the other hand, the white subpixel SPw comprises a transistor section TFT and a white organic light emitting diode WOLED. The white subpixel SPw comprises no color filter because it emits white light as is emitted from the white organic light emitting diode WOLED.

As can be seen from the schematic cross-sectional layer diagram of the subpixel, a white organic light emitting diode (WOLED) formation layer of the white subpixel is lower than those of red, green, and blue subpixels. Thus, the vertical distance between a underlying wire and a first electrode of the white organic light emitting diode is short.

As can be seen from the relationship y1<y2 shown in FIG. 4, the white subpixel SPw has a smaller step difference than the other subpixels SPr to SPb because it comprises no color filter. In the case where the vertical distance between the underlying wire and the first electrode of the white organic light emitting diode WOLED is small, when the pattern (e.g., insulating film, electrode, etc) of the conventional RGBW OLED is lost due to impurities (e.g., particles) introduced during a process (e.g., photolithography, etching, cleaning, etc), short-circuiting or overcurrent occurs between the underlying wire and the first electrode of the organic light emitting diode WOLED. The reason why short-circuiting or overcurrent occurs is because of static electricity, etc generated during patterning of an insulating film, as well as the short vertical distance between the underlying wire and the first electrode of the white organic light emitting diode.

To solve the above-explained problem, the structure of the white subpixel SPw according to present invention is modified as follows.

Figure 5:
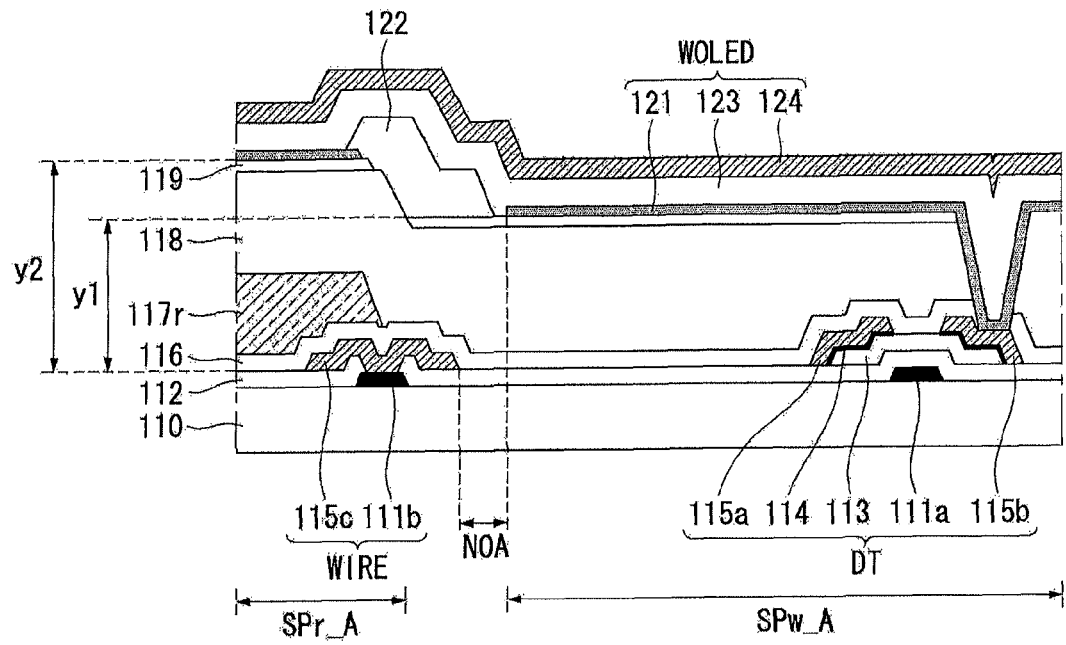
FIG. 5 is a cross-sectional view of a white subpixel according to the first exemplary embodiment of the present invention.
Figure 6:
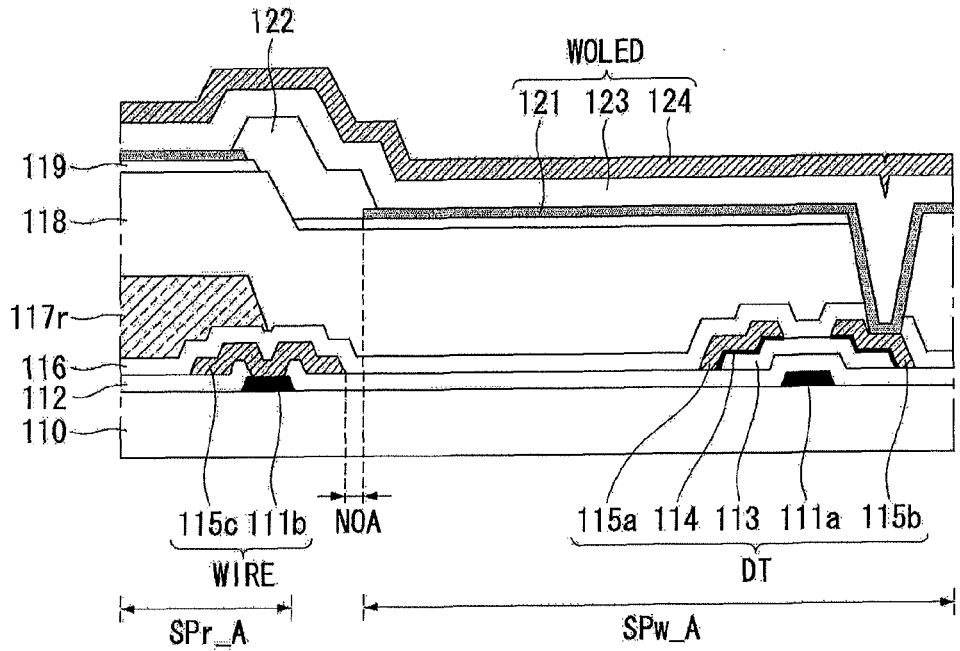
FIG. 6 is an illustration of a first modification of the white subpixel of FIG. 5.
Figure 7:
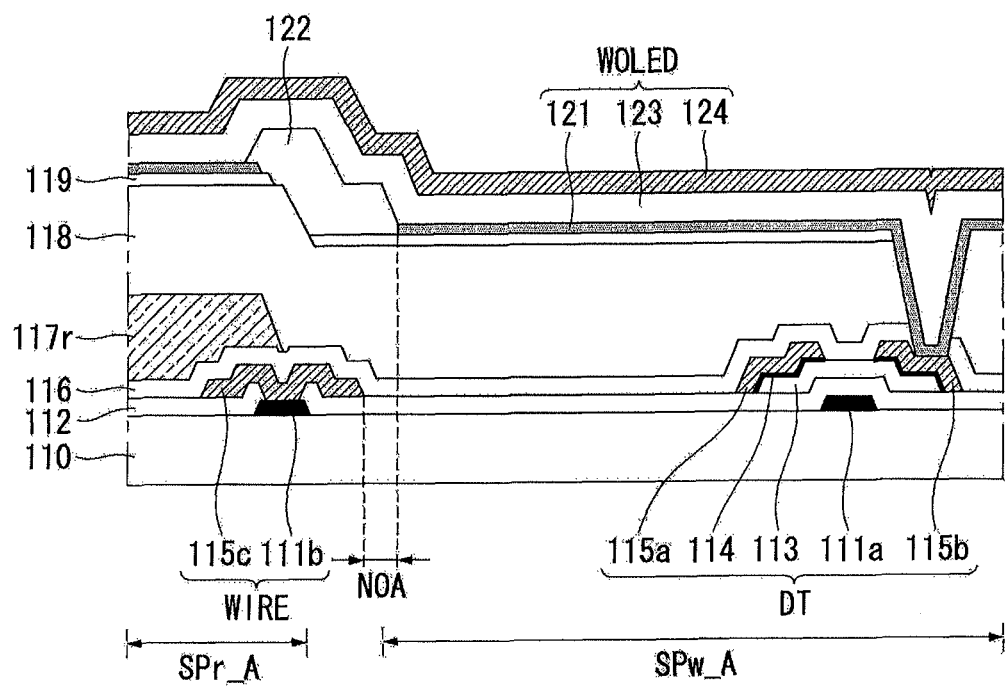
FIG. 7 is an illustration of a second modification of the white subpixel of FIG. 5.
Figure 8:
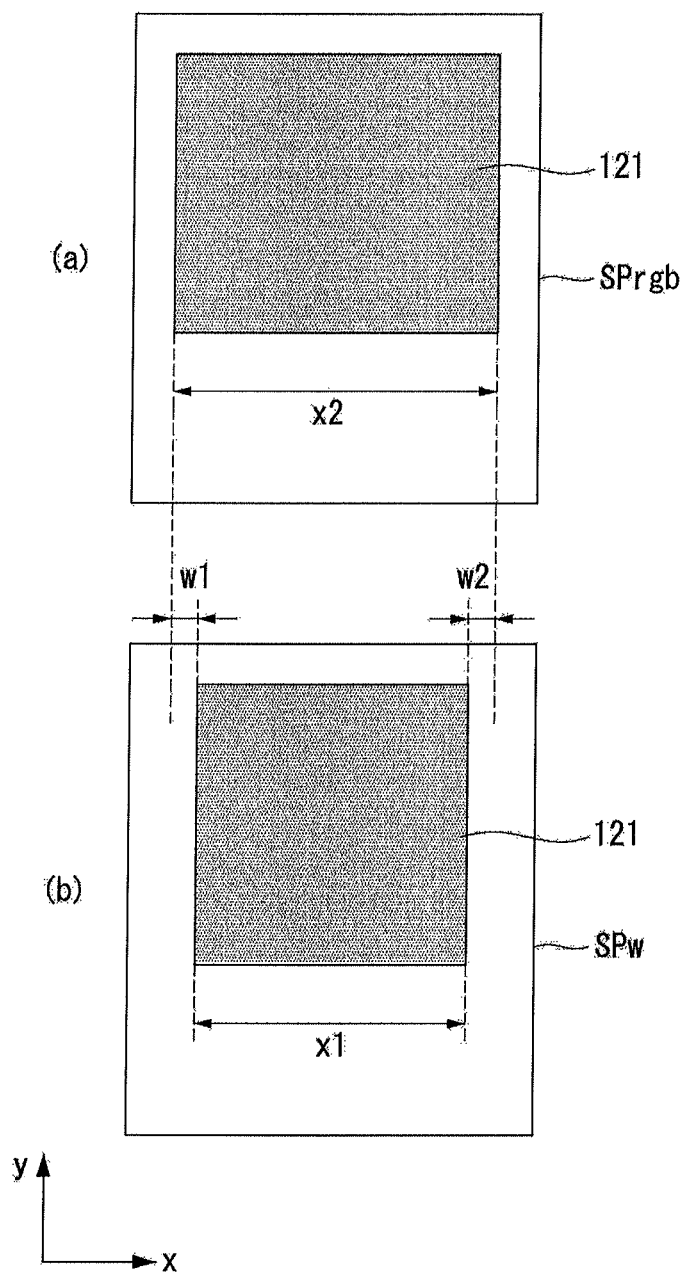
FIG. 8 is a top plan view for explaining the difference between a first electrode formed in the white subpixel and a first electrode formed in other subpixel.

FIG. 5 is a cross-sectional view of a white subpixel according to the first exemplary embodiment of the present invention. FIG. 6 is an illustration of a first modification of the white subpixel of FIG. 5. FIG. 7 is an illustration of a second modification of the white subpixel of FIG. 5. FIG. 8 is a top plan view for explaining the difference between a first electrode formed in the white subpixel and a first electrode formed in other subpixel.

As shown in FIGS. 5 to 7, a white subpixel area SPw_A and a red subpixel area SPr_A are formed on a lower substrate 110a. A driving transistor DT and a white organic light emitting diode WOLED shown in the white subpixel area SPw_A are included in the white subpixel. An R color filter 117r shown in the red subpixel area SPr_A is included in a red subpixel. Also, an underlying wire WIRE shown between the white subpixel area SPw_A and the red subpixel area SPw_A is connected to the red subpixel. The cross-sectional structure will be concretely described below, and distinction between subpixel areas will be mentioned only when necessary.

A gate electrode 111a and a first metal layer 111b are formed on the lower substrate 110a. The gate electrode 111a and the first metal layer 111b are spaced apart from each other. The gate electrode 111a and the first metal layer 111b may be one selected from the group consisting of MO, Al, Cr, Au, Ti, Ni, and Cu, or an alloy thereof, and may be formed as a single layer or multiple layers.

A first insulating film 112 is formed on the gate electrode 111a and the first metal layer 111b. The first insulating film 112 is formed to expose part of the first metal layer 111b. A silicon oxide film SiOx or silicon nitride film SiNx is selected as the first insulating film 112.

A semiconductor layer 113 and an ohmic contact layer 114 are formed on the first insulating film 112 corresponding to the gate electrode 111a. Amorphous silicon (a-Si), polysilicon (poly-Si), an oxide, or an organic matter is selected as the semiconductor layer 113. The ohmic contact layer 114 is a layer for decreasing the contact resistance between the semiconductor layer 113 and source and drain electrodes 115a and 115b to be formed later, and can be omitted.

Source and drain electrodes 115a and 115b are formed on the semiconductor layer 113 or the ohmic contact layer 114, and a second metal layer 115c is formed on the first metal layer 111b. The first metal layer 111b and the second metal layer 115c are electrically connected to constitute the underlying wire WIRE. The source electrode 115a, drain electrode 115b, and second metal layer 115c may be one selected from the group consisting of MO, Al, Cr, Au, Ti, Ni, and Cu or an alloy thereof, and may be formed as a single layer or multiple layers. The driving transistor DT comprises the gate electrode 111a, semiconductor layer 113, ohmic contact layer 114, source electrode 115a, and drain electrode 115b which are formed on the lower substrate 110a.

The transistor section comprises other components, such as scan lines, data lines, and a capacitor, than the white organic light emitting diode WOLED, in addition to the underlying wire WIRE and the driving transistor DT.

The underlying wire WIRE comprises signal lines such as data lines DL1 to DLn and scan lines SL1 to SLm, as well as power lines such as the high-potential power line EVDD and low-potential power line EVSS shown in FIGS. 1 and 2. If the subpixel comprises a compensation circuit, the underlying wire WIRE further comprises an auxiliary power line for supplying an auxiliary voltage, a reference power line for supplying a reference voltage, an initialization power line for supplying an initialization voltage, etc. Therefore, the underlying wire WIRE should be regarded as one of the above-listed lines.

A second insulating film 116 is formed on the source electrode 115a, drain electrode 115b, and second metal layer 115c. The second insulating film 116 is formed to expose part of the drain electrode 115b. A silicon oxide film SiOx or silicon nitride film SiNx is selected as the second insulating film 116.

An R color filter 117r is formed on the second insulating film 116 positioned in the red subpixel area SPr_A. On the other hand, no color filter is formed on the second insulating film 116 positioned in the white subpixel area SPw_A.

A third insulating film 118 is formed on the second insulating film 116 so as to cover the R color filter 117r. The third insulating film 118 is formed to expose part of the drain electrode 115b. An organic insulating film, an inorganic insulating film, or an organic/inorganic insulating film is selected as the third insulating film 118. The first height y1 of the third insulating film 118 positioned in the white subpixel area SPw_A is less than the second height y2 of the third insulating film 118 positioned in the red subpixel area SPr_A. The first height y1 of the third insulating film 118 positioned in the white subpixel area SPw_A is less than the height of the third insulating film positioned in the green and blue subpixel areas. This is because the R color filter 117r is formed below the third insulating film 118 positioned in the red subpixel area SPr_A. Also, this is because a G color filter and a B color filter are formed below the third insulating film 118 positioned in the green and blue subpixel areas. That is, the third insulating film 118 included in the white subpixel has a smaller step difference than the third insulating film 118 included in the red, green, and blue subpixels. The first and second heights y1 and y2 are the vertical distance from the basal plane of the source and drain electrodes 115a and 115b to the basal plane of the third insulating film 118. The height of the third insulating film positioned in the green and blue subpixel areas may correspond to the height of the third insulating film 118 positioned in the red subpixel area SPr_A.

A fourth insulating film 119 is formed on the third insulating film 118. The fourth insulating film 119 is formed to expose part of the drain electrode 115b. A silicon oxide film SiOx or silicon nitride film SiNx is selected as the fourth insulating film 119. The fourth insulating film 119 may be omitted depending on the structure.

A first electrode 121 is formed on the fourth insulating film 119. The first electrode 121 is electrically connected to the drain electrode 115b exposed through the fourth insulating film 119. The first electrode 121 is divided into a first electrode 121 positioned in the white subpixel area SPw_2 and a first electrode 121 positioned in the red subpixel area SPr_A.

The first electrode 121 is formed separately for each of the subpixel areas. The first electrode 121 is an anode. The first electrode 121 is a transparent conductive film, such as ITO (Indium Tin Oxide), IZO (Indium Zinc Oxide), ITZO (Indium Tin Zinc Oxide), ZnO (Zinc Oxide), IGZO (Indium Gallium Zinc Oxide), or graphene.

A bank layer 122 is formed on some regions of the fourth insulating film 119 and first electrode 121 defines an opening of the white subpixel and an opening of the red subpixel. The bank layer 22 defines openings of all the subpixels.

An organic emission layer 123 is formed on the first electrode 121 and the bank layer 122. The organic emission layer 123 emits white light. The organic emission layer 123 comprises a hole injection layer HIL, a hole transparent layer HTL, an emission layer EML, an electron transport layer ETL, and an electron injection layer EIL, and one or more of these layers may be omitted. The organic emission layer 123 may further comprise a functional layer for controlling the movement characteristics of holes and electrons or a functional layer for facilitating interlayer interface stabilization.

A second electrode 124 is formed on the organic emission layer 123. The second electrode 124 is formed as a front electrode so as to be commonly connected to all the subpixel areas. The second electrode 124 is a cathode. The second electrode 124 may be Al, Ag, Mg, Ca, or an alloy thereof, which has a low work function. The second electrode 124 is connected to a low-potential underlying wire. With the above configuration, a white organic light emitting diode WOLED is formed on the transistor section comprising the driving transistor DT.

The first electrode 121 positioned in the white subpixel area SPw_A is spaced apart from the underlying wire WIRE positioned below the second to fourth insulating films 116 to 119 so as not to overlap it. The first electrode 121 positioned in the white subpixel area SPw_2 may be spaced apart from the data lines positioned below the second to fourth insulating films 116 to 119 so as not to overlap them.

More specifically, the first electrode 121 positioned in the white subpixel SPw_A is spaced apart from the bank layer 122 as shown in FIG. 5. Moreover, the first electrode 121 positioned in the white subpixel area SPw_A is in contact with the bank layer 122 as show in FIG. 6. Further, the first electrode 121 positioned in the white subpixel area SPw_A is partially introduced into a lower part of the bank layer 122 as shown in FIG. 7.

However, one end of the first electrode 121 positioned in the white subpixel area SPw_A is spaced apart from one end of the underlying wire WIRE by a non-overlapping area NOA. If the first electrode 121 positioned in the white subpixel area SPw_A has the above structure, the probability of short-circuiting or overcurrent caused by impurities (e.g., particles) can be reduced even if the vertical distance between the first electrode 121 and the underlying wire WIRE is short.

In contrast, the first electrode 121 positioned in the red subpixel area SPr_A and the first electrode positioned in the green and blue subpixel areas are formed so as to overlap the underlying wire WIRE positioned below the second to fourth insulating films 116 to 119.

More specifically, the first electrode 121 positioned in the red subpixel area SPr_A and the first electrode 121 positioned in the green and blue subpixel areas SPr_A are introduced into the bank layer 122 and extend to the ends of the fourth insulating film 119. If the first electrode 121 positioned in the red, green, and blue subpixel areas SPr_A have the same structure, the light emission area is widened. However, the first electrode 121 positioned in the red, green, and blue subpixel areas SPr_A also may be formed so as to overlap the underlying wire WIRE.

Hereinafter, a further explanation regarding the above will be given with respect to the first electrode 121 shown in planar form.

(a) of FIG. 8 shows a planar structure of the first electrode 121 included in the red, green, and blue subpixels SPrgb, and (b) of FIG. 8 shows a planar structure of the first electrode 121 included in the white subpixel SPw.

x1 indicates the length of the first electrode 121 included in the white subpixel SPw in a first direction x, and x2 indicates the length of the first electrode 121 included in the red, green, and blue subpixels SPrgb in the first direction x. The first direction x is the short-axis direction of the subpixels, and a second direction y is the long-axis direction of the subpixels.

The first electrode 121 positioned in the white subpixel SPw has a shorter length in the first direction x to prevent short-circuiting or overcurrent or overcurrent in the underlying wire WIRE. In one example, if the underlying wire WIRE is arranged at the left side of the first electrode 121 positioned in the white subpixel SPw, the length of w1 adjacent to the underlying wire WIRE becomes shorter. In another example, if the underlying wire WIRE is arranged at the right side of the first electrode 121 positioned in the white subpixel SPw, the length of w2 adjacent to the underlying wire WIRE becomes shorter. In still another example, if the underlying wire WIRE is arranged at both opposite sides of the first electrode 121 positioned in the white subpixel SPw, the lengths of w1 and w2 adjacent to the underlying wire WIRE become shorter. Here, w1 indicates the length removed from the left side of the first electrode 121 positioned in the white subpixel SPw, and w2 indicates the length removed from the right side of the first electrode 121 positioned in the white subpixel SPw.

As can be seen from the above explanation, the length in the second direction y of the first electrode 121 positioned in the white subpixel SPw is similar or equal to the length in the second direction y of the first electrode 121 positioned in the red, green, and blue subpixels SPrgb. However, the length in the first direction x of the first electrode 121 positioned in the white subpixel SP1 is shorter than the length in the first direction x of the first electrode 121 positioned in the red, green, and blue subpixels SPrgb by w1, w2, or w1+w2. Accordingly, the relationship between the first electrode 121 positioned in the red, green, and blue subpixels and the first electrode 121 positioned in the white subpixel SP2 when the first electrode 121 positioned in the red, green, and blue subpixels is formed so as to overlap the underlying wire WIRE is summarized by x2>x1.

The white subpixel SP2 has a smaller light emission area than the red, green, and blue subpixels SPrgb according to the relationship x2>x1. However, the white subpixel emits white light as it is without using a color filter. Thus, even if the size of the light emission area is smaller than the size of the red, green, and blue subpixels SPrgb, this does not give a large effect on luminance.

An example of short-circuiting or overcurrent caused by a conventional white subpixel structure and impurities (e.g., particles) will be described below.

Figure 9:
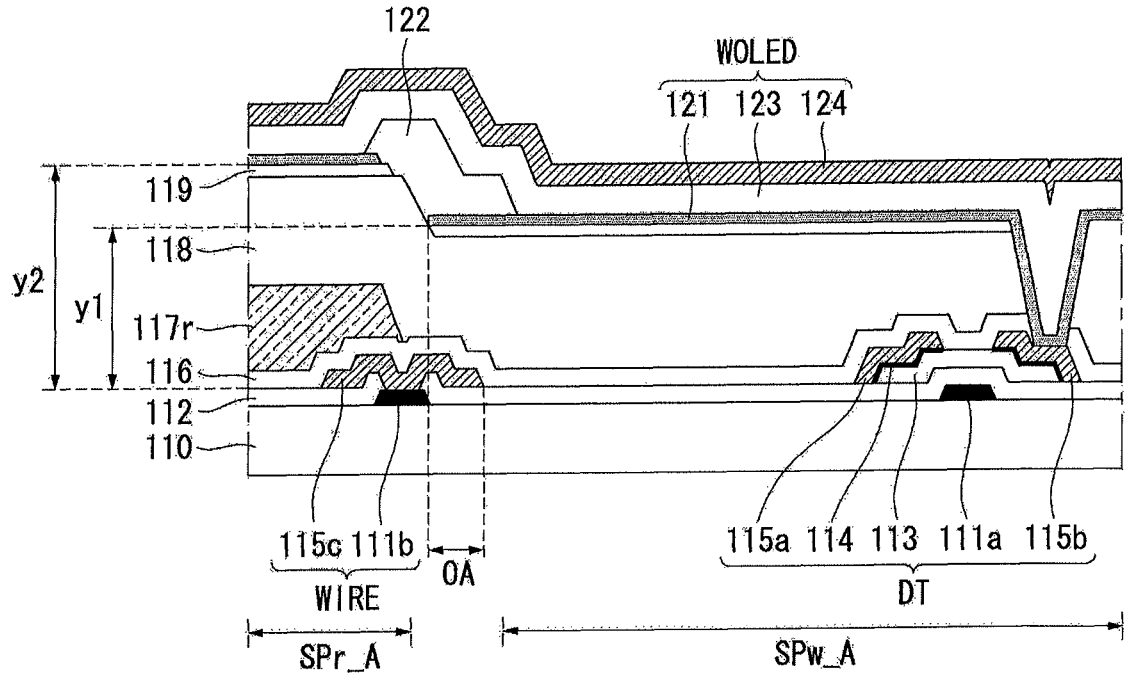
FIG. 9 is a cross-sectional view of a white subpixel structure.
Figure 10:
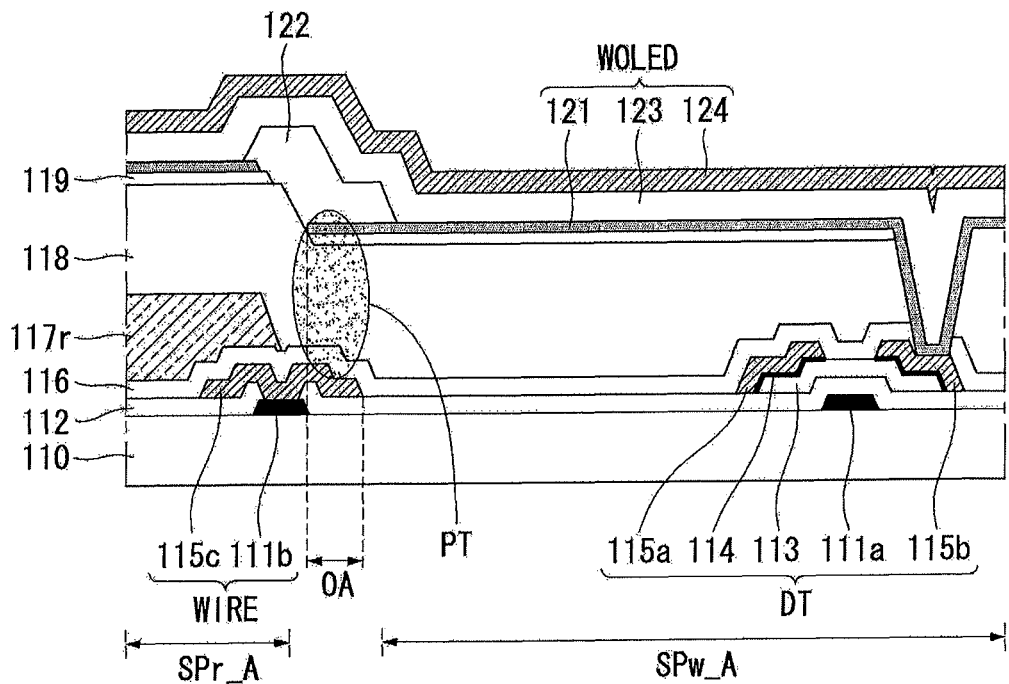
FIG. 10 is a cross-sectional view showing the introduction of particles into the structure of FIG. 9.
Figure 11:
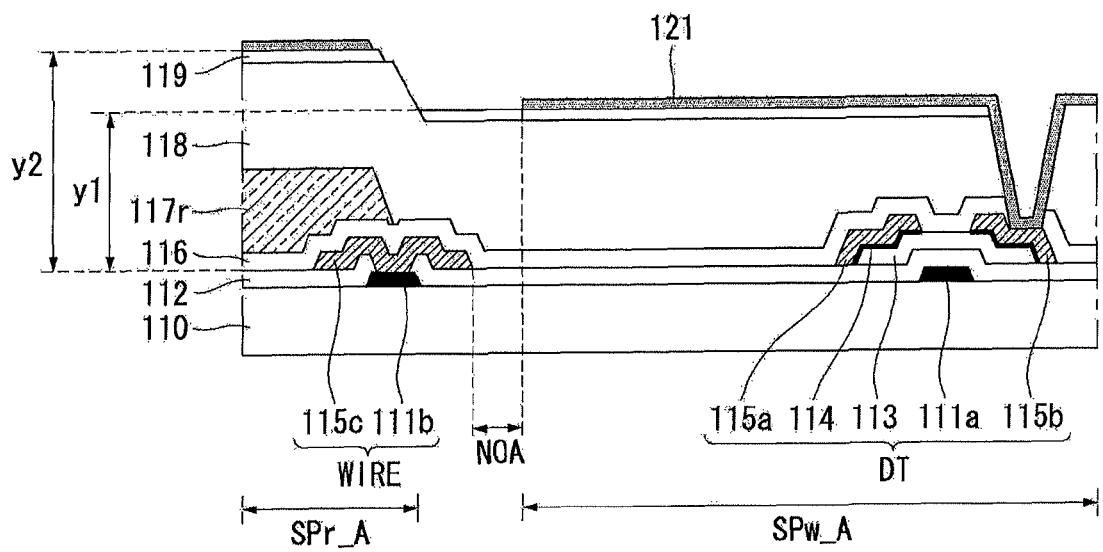
FIGS. 11 to 14 are views for explaining a method for manufacturing an organic light emitting display device according to the first exemplary embodiment of the present invention
Figure 12:
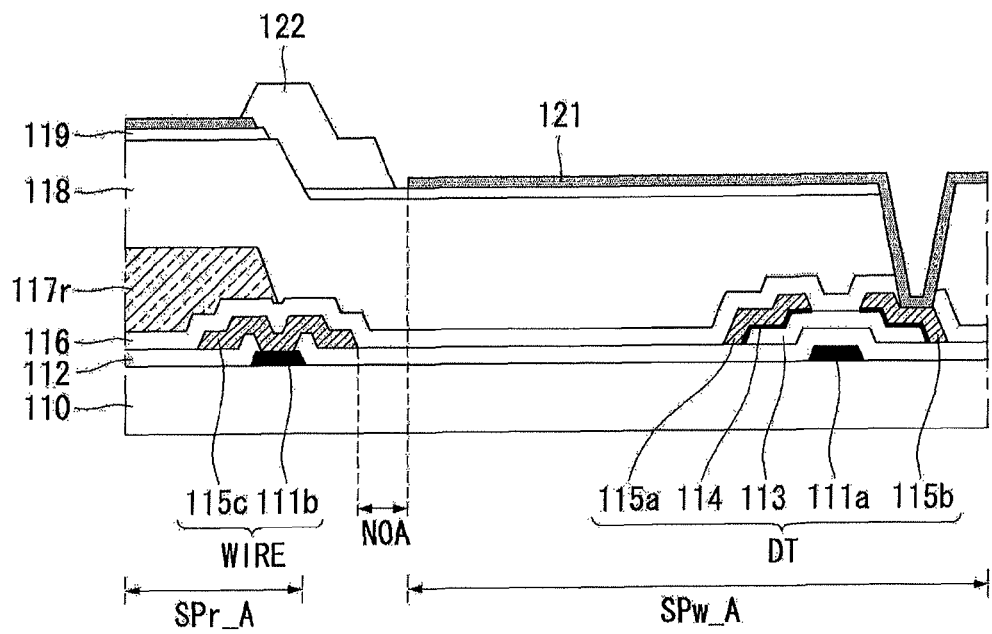
Figure 13:
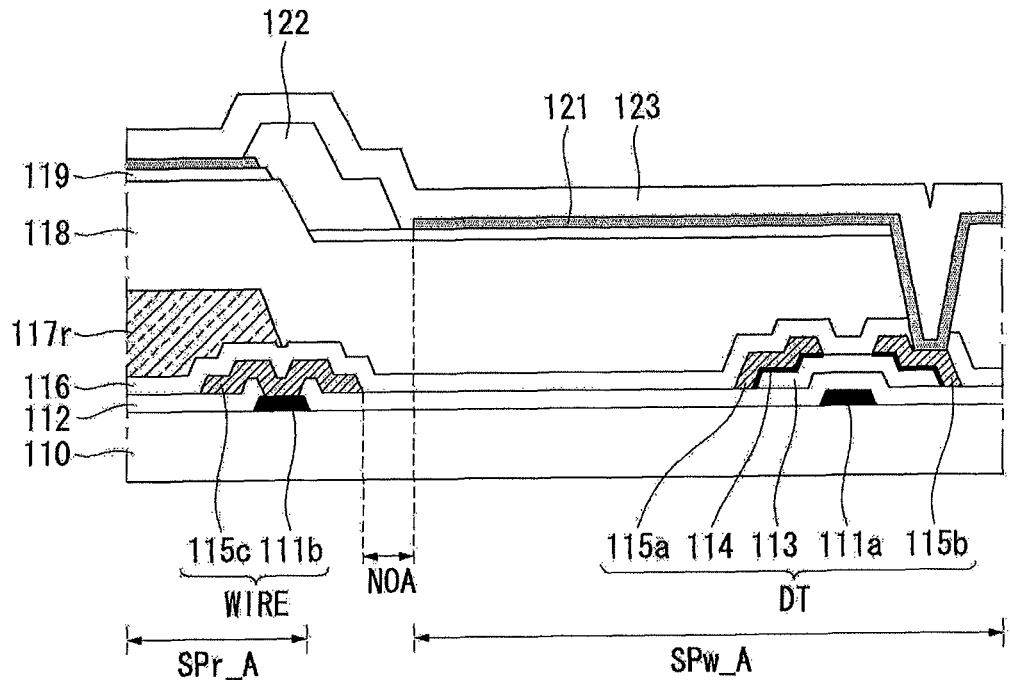
Figure 14:
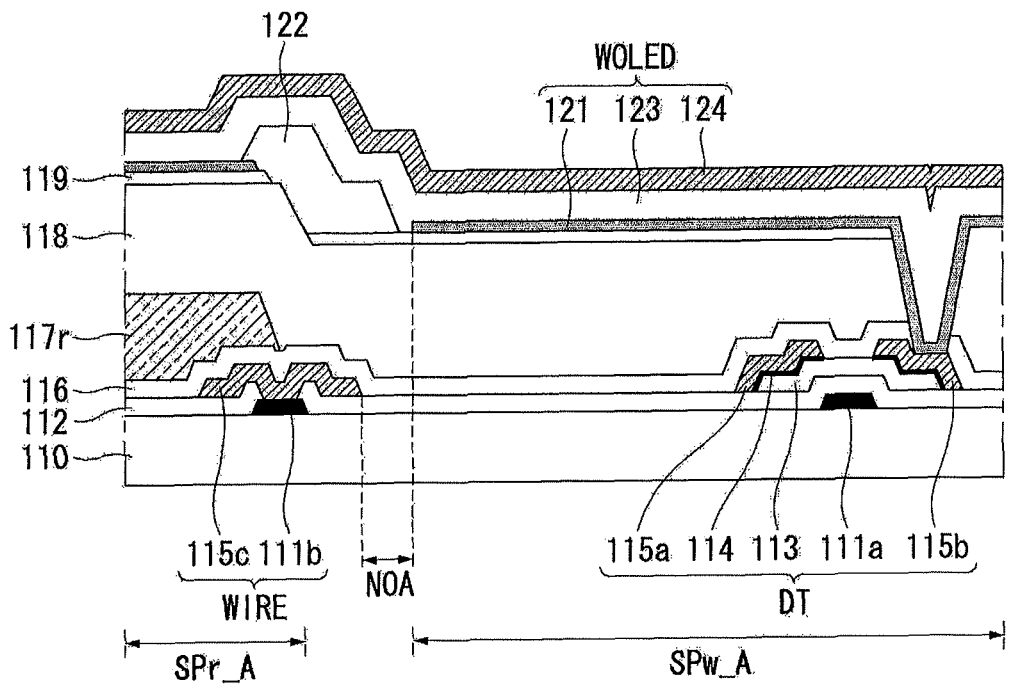

FIG. 9 is a cross-sectional view of a conventional white subpixel structure. FIG. 10 is a cross-sectional view showing the introduction of particles into the structure of FIG. 9.

As shown in FIG. 9, the first electrode 121 positioned in the conventional white subpixel area SPw_A is formed so as to overlap the underlying wire WIRE positioned below the second to fourth insulating films 116 to 119. More specifically, the first electrode 121 positioned in the white subpixel area SPw_A are introduced into the bank layer 122 and extends to the ends of the fourth insulating film 119, and has an overlapping area OA with the underlying wire WIRE. The first electrode 121 positioned in the red, green, and blue subpixel areas SPr_A is formed in the same manner as the first electrode 121 positioned in the white subpixel area SPw_A.

As shown in FIG. 10, the first electrode 121 positioned in the conventional white subpixel area SPw_A is formed so as to overlap the underlying wire WIRE. Thus, when particles PT are introduced during a process (e.g., photolithography, etching, cleaning, etc), short-circuiting or overcurrent occurs between the underlying wire WIRE and the first electrode 121 positioned in the conventional white subpixel area SPw_A. The thickness of a thin film used for the organic light emitting display device is small and expressed in units of μm. Accordingly, when the pattern (e.g., insulating film, electrode, etc) of the white subpixel area SPw_A is lost due to particles PT, etc, short-circuiting or overcurrent occurs between the first electrode 121 and the underlying wire WIRE. In this case, the device may be partially burnt, and this may spread across the entire panel. Such short-circuiting occurs when the particles PT are conductive. Also, even if the particles PT have no conductivity, overcurrent may occur when some regions of the particles PT become conductive due to a thin film or the like formed in a subsequent process; however, the present invention is not limited thereto and overcurrent may occur due to a variety of reasons.

Nevertheless, on the basis of the foregoing description of the present invention with reference to FIGS. 5 to 8, the first electrode 121 positioned in the white subpixel area and the underlying wire WIRE do not overlap each other, and hence the probability of short-circuiting or overcurrent caused by impurities (e.g., particles) can be decreased, even with a short vertical distance between the underlying wire and the first electrode.

A method for manufacturing an organic light emitting display device according to the first exemplary embodiment of the present invention will be described.

FIGS. 11 to 14 are views for explaining a method for manufacturing an organic light emitting display device according to the first exemplary embodiment of the present invention.

As shown in FIGS. 11 to 14, a white subpixel area SPw_A and a red subpixel area SPr_A are formed on a lower substrate 110a. A driving transistor DT and a white organic light emitting diode WOLED shown in the white subpixel area SPw_A are included in the white subpixel. An R color filter 117r shown in the red subpixel area SPr_A is included in a red subpixel. Also, a underlying wire WIRE shown between the white subpixel area SPw_A and the red subpixel area SPr_A is connected to the red subpixel. The cross-sectional structure will be concretely described below, and distinction between subpixel areas will be mentioned only when necessary.

First of all, a gate electrode 111a and a first metal layer 111b are formed on the lower substrate 110a. A first metal is formed on the lower substrate 110a, and then patterned to be divided into the gate electrode 111a and the first metal layer 111b, which are spaced apart from each other. The gate electrode 111a and the first metal layer 111b may be one selected from the group consisting of MO, Al, Cr, Au, Ti, Ni, and Cu, or an alloy thereof, and may be formed as a single layer or multiple layers.

Next, a first insulating film 112 is formed on the gate electrode 111a and the first metal layer 111b. The first insulating film 112 is formed on the lower substrate 110a, and then patterned so as to expose part of the first metal layer 111b. The first insulating film 112 is formed to expose part of the first metal layer 111b. A silicon oxide film SiOx or silicon nitride film SiNx is selected as the first insulating film 112.

Next, a semiconductor layer 113 and an ohmic contact layer 114 are formed on the first insulating film 112 corresponding to the gate electrode 111a. Amorphous silicon (a-Si), polysilicon (poly-Si), an oxide, or an organic matter is selected as the semiconductor layer 113. The ohmic contact layer 114 is a layer for decreasing the contact resistance between the semiconductor layer 113 and source and drain electrodes 115a and 115b to be formed later, and can be omitted.

Next, a second metal is formed on the first insulating film 112, and then patterned to be divided into source and drain electrodes 115a and 115b positioned on the semiconductor layer 113 or the ohmic contact layer 114 and a second metal layer 115c positioned on the first metal layer 11b, which are spaced apart from each other. The first metal layer 111b and the second metal layer 115c are electrically connected to constitute the underlying wire WIRE. As used herein, the underlying wire WIRE consists of the first metal layer 111b and the second metal layer 115c by way of example, and the underlying wire WIRE may consist of the second metal layer 115c alone.

The source electrode 115a, drain electrode 115b, and second metal layer 115c may be one selected from the group consisting of MO, Al, Cr, Au, Ti, Ni, and Cu or an alloy thereof, and may be formed as a single layer or multiple layers. The driving transistor DT comprises the gate electrode 111a, semiconductor layer 113, ohmic contact layer 114, source electrode 115a, and drain electrode 115b, which are formed on the lower substrate 110a. The transistor section comprises other components, such as scan lines, data lines, and a capacitor, than the white organic light emitting diode WOLED, in addition to the underlying wire WIRE and the driving transistor DT.

Next, a second insulating film 116 is formed on the first insulating film 112 so as to cover the source electrode 115a, drain electrode 115b, and second metal layer 115c. A silicon oxide film SiOx or silicon nitride film SiNx is selected as the second insulating film 116.

Next, an R color filter 117r is formed on the second insulating film 116 positioned in the red subpixel area SPr_A. A G color filter and a B color filter are formed on the second insulating film 116 positioned in the red and blue subpixel areas. On the other hand, no color filter is formed on the second insulating film 116 positioned in the white subpixel area SPw_A.

Next, a third insulating film 118 is formed so as to cover the R color filter 117r and the second insulating film 116. An organic insulating film, an inorganic insulating film, or an organic/inorganic insulating film is selected as the third insulating film 118. The first height y1 of the third insulating film 118 positioned in the white subpixel area SPw_A is less than the second height y2 of the third insulating film 118 positioned in the red subpixel area SPr_A. The first height y1 of the third insulating film 118 positioned in the white subpixel area SPw_A is less than the height of the third insulating film positioned in the green and blue subpixel areas. This is because the R color filter 117r is formed below the third insulating film 118 positioned in the red subpixel area SPr_A. Also, this is because a G color filter and a B color filter are formed below the third insulating film 118 positioned in the green and blue subpixel areas. That is, the third insulating film 118 included in the white subpixel has a smaller step difference than the third insulating film 118 included in the red, green, and blue subpixels. The first and second heights y1 and y2 are the vertical distance from the basal plane of the source and drain electrodes 115a and 115b to the basal plane of the third insulating film 118. The height of the third insulating film positioned in the green and blue subpixel areas may correspond to the height of the third insulating film 118 positioned in the red subpixel area SPr_A.

Next, a fourth insulating film 119 is formed on the third insulating film 118, and patterned so as to expose part of the drain electrode 115b. A silicon oxide film SiOx or silicon nitride film SiNx is selected as the fourth insulating film 119.

Next, a first electrode 121 is formed on the fourth insulating film 119. The first electrode 121 is electrically connected to the drain electrode 115b exposed through the fourth insulating film 119. The first electrode 121 is divided into a first electrode 121 positioned in the white subpixel area SPw_2 and a first electrode 121 positioned in the red subpixel area SPr_A. The first electrode 121 is formed separately for each of the subpixel areas. The first electrode 121 is an anode. The first electrode 121 is a transparent conductive film, such as ITO (Indium Tin Oxide), IZO (Indium Zinc Oxide), ITZO (Indium Tin Zinc Oxide), ZnO (Zinc Oxide), IGZO (Indium Gallium Zinc Oxide), or graphene.

The first electrode 121 positioned in the white subpixel area SPw_A is spaced apart from the underlying wire WIRE positioned below the second to fourth insulating films 116 to 119 so as not to overlap it.

More specifically, the first electrode 121 positioned in the white subpixel SPw_A is spaced apart from the bank layer 122 as shown in FIG. 5. Moreover, the first electrode 121 positioned in the white subpixel area SPw_A is in contact with the bank layer 122 as show in FIG. 6. Further, the first electrode 121 positioned in the white subpixel area SPw_A is partially introduced into a lower part of the bank layer 122 as shown in FIG. 7.

However, one end of the first electrode 121 is spaced apart from one end of the underlying wire WIRE by a non-overlapping area NOA. If the first electrode 121 positioned in the white subpixel area SPw_A has the above structure, the probability of short-circuiting or overcurrent caused by impurities (e.g., particles) can be reduced even if the vertical distance between the first electrode 121 and the underlying wire WIRE is short.

In contrast, the first electrode 121 positioned in the red subpixel area SPr_A and the first electrode positioned in the green and blue subpixel areas are formed so as to overlap the underlying wire WIRE positioned below the second to fourth insulating films 116 to 119.

More specifically, the first electrode 121 positioned in the red subpixel area SPr_A and the first electrode 121 positioned in the green and blue subpixel areas SPr_A are introduced into the bank layer 122 and extend to the ends of the fourth insulating film 119. If the first electrode 121 positioned in the red, green, and blue subpixel areas SPr_A have the same structure, the light emission area is widened. However, the first electrode 121 positioned in the red, green, and blue subpixel areas SPr_A also may be formed so as to overlap the underlying wire WIRE.

Next, a bank layer 122 is formed on some regions of the fourth insulating film 119 and first electrode 121 defines an opening of the white subpixel and an opening of the red subpixel. The bank layer 22 defines openings of all the subpixels.

Next, an organic emission layer 123 is formed on the first electrode 121 and the bank layer 122. The organic emission layer 123 emits white light. The organic emission layer 123 comprises a hole injection layer HIL, a hole transparent layer HTL, an emission layer EML, an electron transport layer ETL, and an electron injection layer EIL, and one or more of these layers may be omitted. The organic emission layer 123 may further comprise a functional layer for controlling the movement characteristics of holes and electrons or a functional layer for facilitating interlayer interface stabilization.

Next, a second electrode 124 is formed on the organic emission layer 123. The second electrode 124 is formed as a front electrode so as to be commonly connected to all the subpixel areas. The second electrode 124 is a cathode. The second electrode 124 may be Al, Ag, Mg, Ca, or an alloy thereof, which has a low work function. The second electrode 124 is connected to a low-potential underlying wire. With the above configuration, a white organic light emitting diode WOLED is formed on the transistor section comprising the driving transistor DT.

Hereinafter, a second exemplary embodiment of the present invention will be described.

Second Exemplary Embodiment

Figure 15:
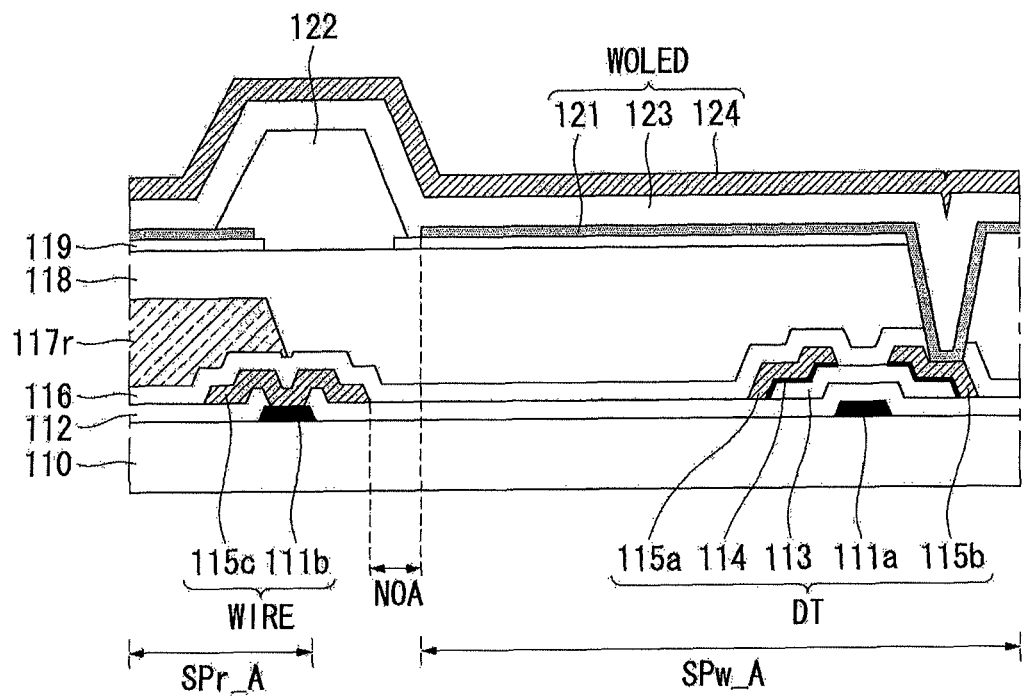
FIG. 15 is a cross-sectional view of a white subpixel according to a second exemplary embodiment of the present invention.

FIG. 15 is a cross-sectional view of a white subpixel according to a second exemplary embodiment of the present invention.

Unlike in FIGS. 5 to 7, the white subpixel shown in FIG. 15 has a smaller step difference in the third insulating film 118. More specifically, the height of the third insulating film 118 positioned in the white subpixel area SP2_A is similar or equal to the height of the third insulating film 118 positioned in the red subpixel area SPr_A. The height of the third insulating film 118 positioned in the white subpixel area SP2_A is likewise similar or equal to the height of the third insulating film 118 positioned in the green and blue subpixel areas.

In the second exemplary embodiment of the present invention, the height of the third insulating film 118 positioned in all of the subpixels is similar or equal. The first electrode 121 positioned in the white subpixel SPw_A is spaced apart from the bank layer 122 as shown in FIG. 15. Moreover, the first electrode 121 positioned in the white subpixel area SPw_A is in contact with the bank layer 122 (see FIG. 6). Further, the first electrode 121 positioned in the white subpixel area SPw_A is partially introduced into a lower part of the bank layer 122 (see FIG. 7).

However, one end of the first electrode 121 positioned in the white subpixel area SPw_A is spaced apart from one end of the underlying wire WIRE by a non-overlapping area NOA. If the first electrode 121 positioned in the white subpixel area SPw_A has the above structure, the probability of short-circuiting or overcurrent caused by impurities (e.g., particles) can be reduced even if the vertical distance between the first electrode 121 and the underlying wire WIRE is short.

In contrast, the first electrode 121 positioned in the red subpixel area SPr_A and the first electrode positioned in the green and blue subpixel areas are formed so as to overlap the underlying wire WIRE positioned below the second to fourth insulating films 116 to 119.

As seen from above, the present invention provides an organic light emitting display device which is capable of improving the production yield of the panel by decreasing the probability of short-circuiting or overcurrent between the underlying wire and the first electrode included in the white subpixel due to impurities introduced during a process.

In the foregoing exemplary embodiment, the probability of short-circuiting or overcurrent is reduced by varying the structure of the first electrode 121. A reduction in the probability of short-circuiting or overcurrent can also be achieved by varying the structure of the fourth insulating film 119 contacting the first electrode 121.

Third Exemplary Embodiment

Figure 16:
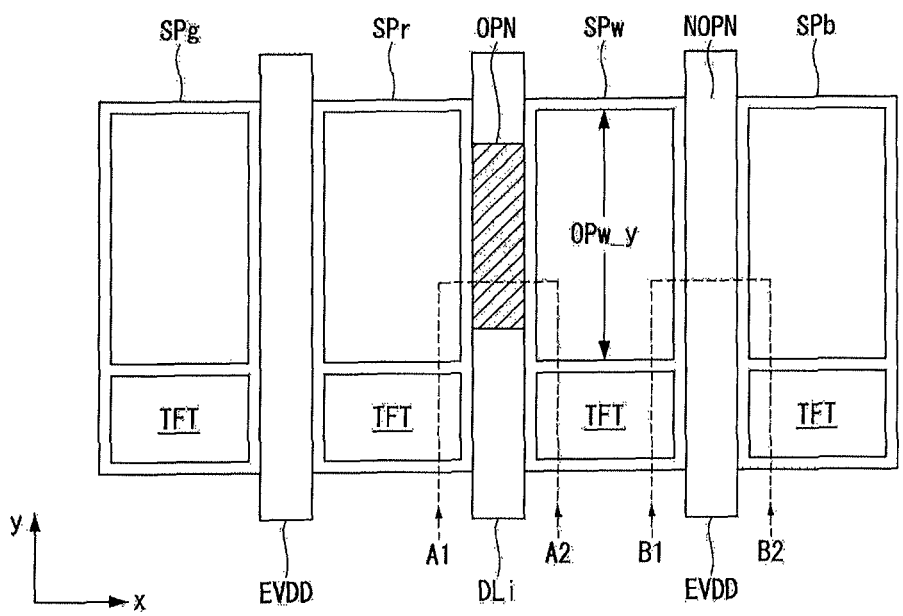
FIG. 16 is a top plan view of subpixels according to a third exemplary embodiment of the present invention.
Figure 17:
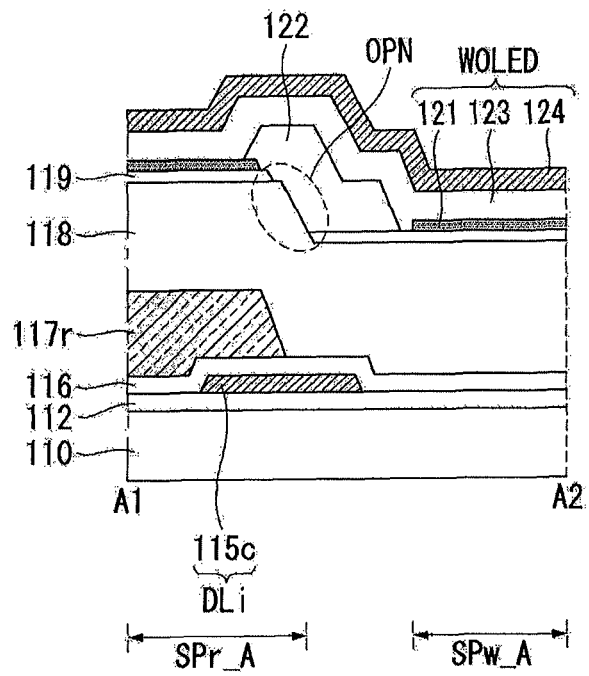
FIG. 17 is a cross-sectional view of area A1-A2 of FIG. 16.
Figure 18:
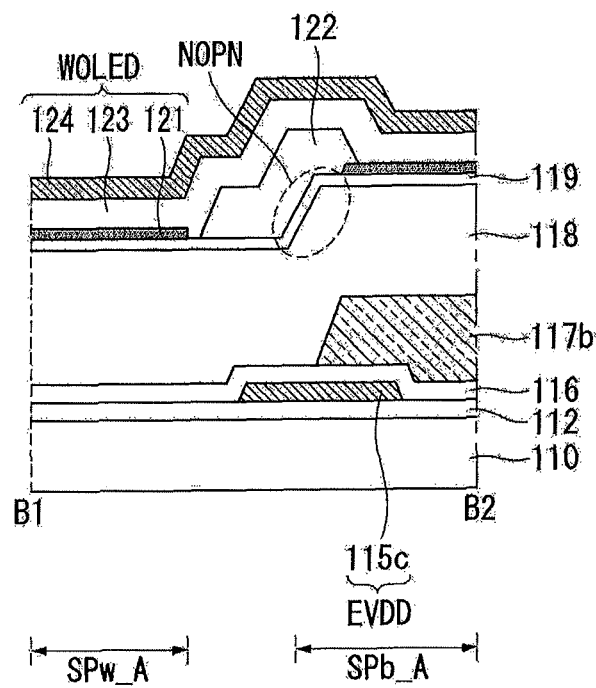
FIG. 18 is a cross-sectional view of area B1-B2 of FIG. 16.

FIG. 16 is a top plan view of subpixels according to a third exemplary embodiment of the present invention. FIG. 17 is a cross-sectional view of area A1-A2 of FIG. 16. FIG. 18 is a cross-sectional view of area B1-B2 of FIG. 16.

As shown in FIGS. 16 to 18, green, red, white, and blue subpixels SPg to SPb are arranged. Although the subpixels are illustrated as being arranged as green, red, white, and blue subpixels SPg to SPb, the present invention is not limited to this example. The structure of the green, red, white, and blue subpixels SPg to SPb may employ the structure of the first or second exemplary embodiment. In the third exemplary embodiment, however, the underlying wire has a single layer structure, rather than a multilayer structure, to describe the structure of the present invention in various ways.

In the third exemplary embodiment, the fourth insulating film 119 comprises a non-exposed area NOPN fully covering the third insulating film 118 and an exposed area OPN exposing part of the third insulating film 118. The non-exposed area NOPN of the fourth insulating film 119 corresponds to a position of the underlying wire adjacent to the white subpixel SPw, and the exposed area OPN of the fourth insulating film 119 corresponds to a position of the underlying wire adjacent to the white subpixel SPw.

As shown in FIG. 16, the underlying wire adjacent to the right side of the white subpixel SPw may be a high-potential power line EVDD arranged in the second direction y, and the underlying wire adjacent to the left side of the white subpixel SPw may be a data line DLi arranged in the second direction y.

In this case, the non-exposed area NOPN of the fourth insulating film 119 corresponds to the position of the high-potential power line EVDD adjacent to the white subpixel SPw, and the exposed area OPN of the fourth insulating film 119 corresponds to the position of the ith data line DLi adjacent to the white subpixel SPw.

However, as explained in the first exemplary embodiment, the underlying wire comprises signal lines such as data lines DL1 to DLn and scan lines SL1 to SLm, as well as power lines such as the high-potential power line EVDD and low-potential power line EVSS shown in FIGS. 1 and 2.

If the subpixel comprises a compensation circuit, the underlying wire further comprises an auxiliary power line for supplying an auxiliary voltage, a reference power line for supplying a reference voltage, an initialization power line for supplying an initialization voltage, etc. Therefore, the underlying wire should be regarded as one of the above-listed lines.

Now, an underlying structure comprising the fourth insulating film 119 will be described with respect to the exposed area OPN and the non-exposed portion NOPN, respectively.

[Exposed Area: FIG. 17]

A first insulating film 112 is formed on the lower substrate 110a. A second metal layer 115c is formed on the first insulating film 112. The second metal layer 115c serves as an ith data line DLi. A second insulating film 116 is formed on the second metal layer 115c. An R color filter 117r included in the red subpixel area SPr_A is formed on the second insulating film 116. A third insulating film 118 is formed on the second insulating film 116. The third insulating film 118 is formed to cover the R color filter 117r. A fourth insulating film 119 is formed on the third insulating film 118. The fourth insulating film 119 has an exposed area OPN exposing part of the third insulating film 118 corresponding to the position of the ith data line DLi.

[Non-Exposed Area: FIG. 18]

A first insulating film 112 is formed on the lower substrate 110a. A second metal layer 115c is formed on the first insulating film 112. The second metal layer 115c serves as an ith data line DLi. A second insulating film 116 is formed on the second metal layer 115c. An R color filter 117r included in the red subpixel area SPr_A is formed on the second insulating film 116. A third insulating film 118 is formed on the second insulating film 116. The third insulating film 118 is formed to cover the R color filter 117r. A fourth insulating film 119 is formed on the third insulating film 118. The fourth insulating film 119 has a non-exposed area NOPN fully covering the third insulating film 118 corresponding to the position of the high-potential power line EVDD.

The fourth insulating film 119 is formed of the above-described structure due to the following reasons.

The fourth insulating film 119 is used to increase color reproducibility in the representation of colors using light produced from the organic emission layer. The third insulating film 118 positioned below the fourth insulating film 119 functions to maintain a gap between the transistor section TFT and the organic light emitting diode WOLED and electrically separate and insulate them.

An organic insulating film may be selected as the third insulating film 118 positioned below the fourth insulating film 119. The third insulating film 118 formed of an organic insulating film causes outgassing.

Outgassing causes deterioration or shrinkage of the organic emission layer, thus shortening the lifespan of the subpixels. For this reason, the non-exposed area OPN, called an air hole, is formed during the formation of the fourth insulating film 119. Gas produced from the third insulating film 118 is released via the exposed area OPN.

In the structure of the third exemplary embodiment, the exposed area OPN serving as an air hole is formed only in some region of the fourth insulating film 119. Dry etching is used to form the exposed area OPN in the fourth insulating film 119. Static electricity generated in this process causes a lot of surface damage enough to damage the high-potential power line EVDD.

Due to this, the exposed area OPN is formed only in an area corresponding to the position of the data line, and the exposed area OPN is not formed in an area corresponding to the position of the high-potential power line EVDD.

In the structure of the third exemplary embodiment, the area corresponding to the high-potential power line EVDD is not exposed. This prevents surface damage, which would otherwise lead to short-circuiting between the high-potential power line EVDD and the first electrode 121 or short-circuiting between the first electrode 121 and the second electrode 124 serving as a low-potential power line in a subsequent process.

Moreover, in the structure of the third exemplary embodiment, the fourth insulating film 119 is left as it is so as to cover the third insulating film 118 positioned in the area corresponding to the high-potential power line EVDD. Accordingly, the vertical distance between the high-potential power line EVDD and the second electrode 124 serving as the low-potential power line increases, thereby decreasing the probability of short-circuiting caused by impurities or the like.

The reason why the exposed area OPN and the non-exposed area NOPN are separately formed in the fourth insulating film 119 is because the white subpixel SPw has a smaller step difference than the other subpixels SPr to SPb because it has no color filter.

For this reason, the third exemplary embodiment of the present invention has been described with respect to the high-potential power line EVDD and the ith data line DLi positioned at the left and right sides of the white subpixel SPw. However, this is merely an illustration, and this structure can be applied to the red, green, and blue subpixels SPr, SPg, and SPb as well, even when the red, green, blue, and white subpixels SPr, SPg, SPb, and SPw have the same step difference (see the example of FIG. 15). That is, the third exemplary embodiment can be applied to the second exemplary embodiment shown in FIG. 15.

The size of the exposed area OPN serving as an air hole can be calculated based on the thickness of the third insulating film 118, the thickness of the fourth insulating film 119, or the size of the openings of the subpixels. For instance, the exposed area OPN of the fourth insulating film 119 is smaller than the vertical length OPw_y defining the opening of the white subpixel SPw.

Figure 19:
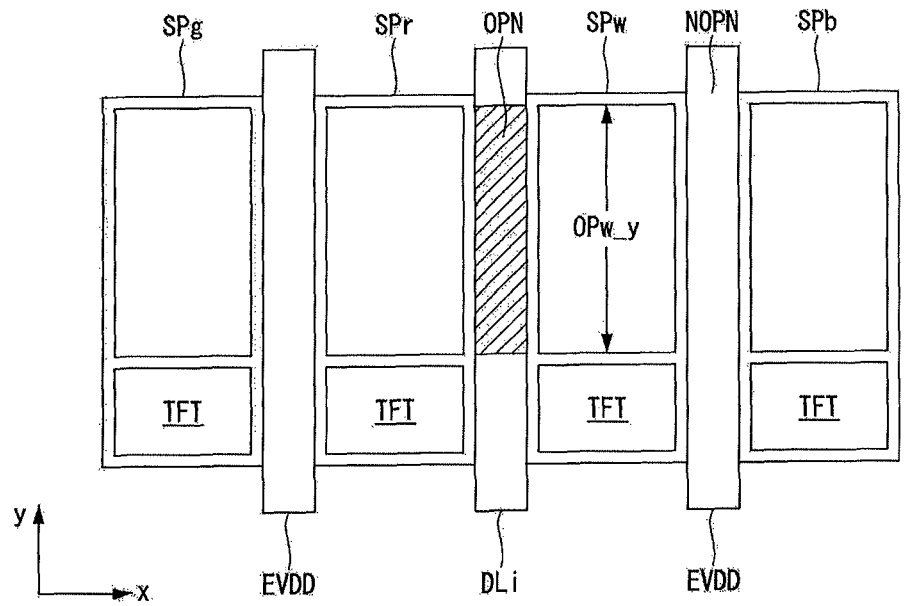
FIG. 19 is an illustration of a first modification of the subpixels of FIG. 16.
Figure 20:
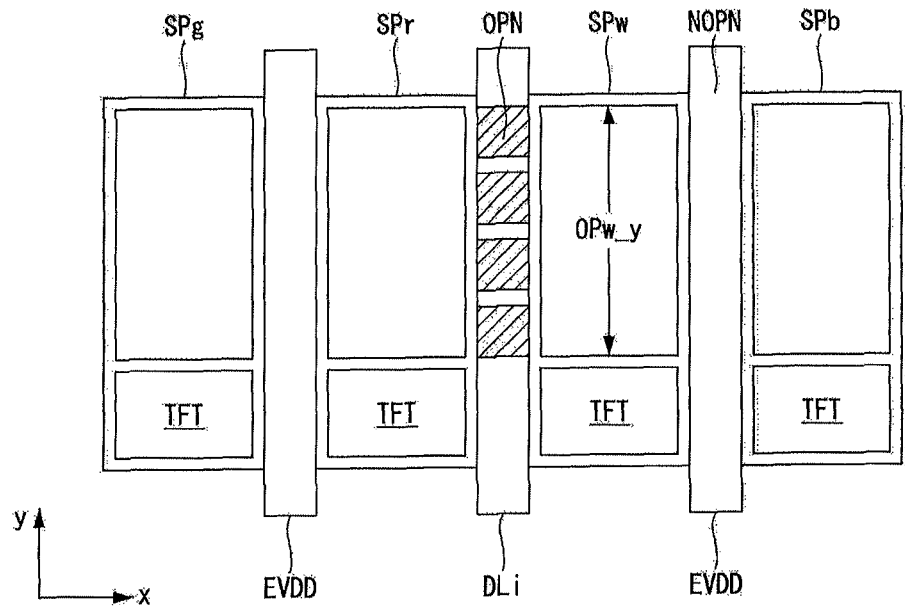
FIG. 20 is an illustration of a second modification of the subpixels of FIG. 16.

FIG. 19 is an illustration of a first modification of the subpixels of FIG. 16. FIG. 20 is an illustration of a second modification of the subpixels of FIG. 16.

As shown in FIG. 19, according to the illustration of the first modification, the size of the exposed area OPN serving as an air hole corresponds to the vertical length OPw_y defining the opening of the white subpixel SPw.

As shown in FIG. 20, according to the illustration of the second modification, an N number of exposed areas OPN serving as air holes are formed (n is an integer of 1 or more).

A method for manufacturing an organic light emitting display device according to the third exemplary embodiment of the present invention will be described below.

The method for manufacturing an organic light emitting display device according to the third exemplary embodiment of the present invention is identical or similar to the method for manufacturing an organic light emitting display device according to the first exemplary embodiment of the present invention, except for the process of forming an exposed area OPN and an non-exposed area NOPN in the fourth insulating film 119. Accordingly, the process until the formation of the third insulating film 118 on the lower substrate 110a will be described with reference to the first exemplary embodiment, and the subsequent description will be given with reference to FIGS. 16 to 20.

The fourth insulating film 119 is formed on the third insulating film 118, the non-exposed area NOPN fully covering the third insulating film 118 and the exposed area OPN exposing part of the third insulating film 118 are defined, and dry etching is performed on the exposed area OPN to remove the fourth insulating film 119.

For example, the underlying wire adjacent to the right side of the white subpixel SPw may be high-potential power line EVDD arranged in the second direction y, and the underlying wire adjacent to the left side of the white subpixel SPw may be a data line DLi arranged in the second direction y.

In this case, the non-exposed area NOPN of the fourth insulating film 119 corresponds to the position of the high-potential power line EVDD adjacent to the white subpixel SPw, and the exposed area OPN of the fourth insulating film 119 corresponds to the position of the ith data line DLi adjacent to the white subpixel SPw.

Accordingly, the fourth insulating film 119 corresponding to the position of the ith data line DLi is dry-etched to form the exposed area OPN.

Next, the first electrode 121, the bank layer 122, the organic emission layer 123, and the second electrode 124 are formed on the fourth insulating film 119. The process of forming the first electrode 121, bank layer 122, organic emission layer 123, and second electrode 124 will be described with reference to the first exemplary embodiment.

As seen from above, the present invention provides an organic light emitting display device which is capable of improving the production yield of the panel by decreasing the probability of short-circuiting or overcurrent between the underlying wire and the first electrode included in the white subpixel due to impurities introduced during a process and decreasing the probability of short-circuiting caused by damage to the underlying wire or by a reduction in the vertical distance between the high-potential power line and the low-potential power line.

The foregoing first to third exemplary embodiments of the present invention may be implemented individually or in appropriate combinations. In one example, the present invention may be implemented in a combination of the structure of the first electrode explained in the first exemplary embodiment and the structure of the fourth insulating film explained in the third exemplary embodiment. In another example, the present invention may be implemented in a combination of the structure of the first electrode explained in the second exemplary embodiment and the structure of the fourth insulating film explained in the third exemplary embodiment.

What is claimed is:

1. An organic light emitting display device comprising:
 a substrate;
 a underlying wire on the substrate; and
 red, green, blue and white subpixels each comprising a transistor section on the substrate and an organic light emitting diode, the red, green blue subpixels comprising red, green and blue color filters, respectively;
 a first insulating film in direct contact with the red, green and blue color filters and extending to the white subpixel; and
 a second insulating film disposed on and in direct contact with the first insulating film and extending in the red, green, blue and white subpixels, the second insulating film exposing a portion of the first insulating film,
 wherein a first electrode included in the white subpixel is non-overlapped with the underlying wire and is spaced apart from the underlying wire, and a first electrode included in at least one subpixel of the red, green and blue subpixels is overlapped with the underlying wire, the first electrodes in the white, red, green and blue subpixels are disposed above the second insulating film.

2. The organic light emitting display device of claim 1, wherein the length in a first direction of the first electrode included in the white subpixel is shorter than the length in the first direction of the first electrode of the red, green, and blue subpixels.

3. The organic light emitting display device of claim 1, wherein the first electrode included in the white subpixel is spaced apart from a bank layer defining an opening to expose the portion of the first insulating film, in contact with the bank layer or partially introduced into a lower part of the bank layer.

4. The organic light emitting display device of claim 1, wherein the white subpixel has a smaller light emission area than the red, green, and blue subpixels.

5. The organic light emitting display device of claim 1, wherein the underlying wire comprises power lines for transmitting electric power or signal lines for transmitting signals.

6. The organic light emitting display device of claim 1, wherein a vertical distance between the first electrode included in the white subpixel and the substrate is shorter than a vertical distance between the first electrode included in the at least one subpixel of the red, green and blue subpixels and the substrate.

7. The organic light emitting display device of claim 1, wherein a vertical distance between the first electrode included in the white subpixel and the substrate is same as a vertical distance between the first electrode included in the at least one subpixel of the red, green and blue subpixels and the substrate.

8. The organic light emitting display device of claim 1, wherein a vertical distance between a bank layer defining an opening of the white subpixel and the substrate is shorter than a vertical distance between a bank layer defining an opening of the at least one subpixel of the red, green and blue subpixels and the substrate.

9. An organic light emitting display device comprising:
a substrate;
a underlying wire on the substrate;
red, green, blue and white subpixels each comprising a transistor section on the substrate and an organic light emitting diode;
an insulating layer contacting a first electrode of the red, green, blue and white subpixels and comprising two or more insulating films; and
a bank layer defining an opening on the insulating layer,
wherein the insulating layer comprises an unexposed area and an exposed area and at least a portion of the bank layer directly contacts two insulating films of the insulating layer.

10. The organic light emitting display device of claim 9, wherein the non-exposed area corresponds to a position of the power line adjacent to at least one subpixel of the red, green, blue and white subpixels, and the exposed area corresponds to a position of the signal line adjacent to the at least one subpixel.

11. The organic light emitting display device of claim 10, wherein one directional length of the exposed area corresponds to or is smaller than that of an opening of the white subpixel.

12. The organic light emitting display device of claim 9, wherein the first electrode included in the white subpixel is non-overlapped with the underlying wire and is spaced apart from the underlying wire, and the first electrode included in at least one subpixel of the red, green and blue subpixels is overlapped with the underlying wire.

13. The organic light emitting display device of claim 9, wherein a vertical distance between the first electrode included in the white subpixel and the substrate is shorter than a vertical distance between the first electrode included in at least one subpixel of the red, green and blue subpixels and the substrate.

14. The organic light emitting display device of claim 9, wherein a vertical distance between the first electrode included in the white subpixel and the substrate is same as a vertical distance between the first electrode included in at least one subpixel of the red, green and blue subpixels and the substrate.

15. The organic light emitting display device of claim 9, wherein a vertical distance between a bank layer defining an opening of the white subpixel and the substrate is shorter than a vertical distance between a bank layer defining an opening of at least one subpixel of the red, green and blue subpixels and the substrate.

16. A method for manufacturing an organic light emitting display device comprising: a substrate; a underlying wire formed on the substrate; and red, green, blue and white subpixels each comprising a transistor section formed on the substrate and an organic light emitting diode, the red, green and blue subpixels including red, green and blue color filters, the method comprising:
forming a first insulating film on and in contract with the red, green and blue filters, the first insulating film extending to the white subpixel;
forming a second insulating film on the first insulating film and extending in the red, green, blue and white subpixels, the second insulating film exposing a portion of the first insulating film;
forming a first electrode of the red, green, blue and white subpixels on the second insulating film, wherein the first electrode included in the white subpixel is non-overlapped with the underlying wire and is spaced apart from the underlying wire, and the first electrode included in at least one subpixel of the red, green and blue subpixels is overlapped with the underlying wire;
forming a bank layer defining an opening to expose the portion of the first insulating film;
forming an organic emission layer on the first electrode; and
forming a second electrode on the organic emission layer.

17. The method of claim 16, wherein the length in a first direction of the first electrode included in the white subpixel is shorter than the length in the first direction of the first electrode of the red, green, and blue subpixels.

18. The method of claim 16, wherein the first electrode included in the white subpixel is in contact with the bank layer, or partially introduced into a lower part of the bank layer.

19. A method for manufacturing an organic light emitting display device comprising: a substrate; an underlying wire formed on the substrate; and red, green, blue and white subpixels each comprising a transistor section formed on the substrate and an organic light emitting diode, the method comprising:
forming an insulating layer comprising two or more insulating films;
forming a first electrode of the red, green, blue and white subpixels on the insulating layer;
forming a bank layer defining an opening on the insulating layer;
forming an organic emission layer on the first electrode; and
forming a second electrode on the organic emission layer,
wherein the insulating layer comprises a non-exposed area and an exposed area and at least a portion of the bank layer directly contacts two insulating films of the insulating layer.

20. The method of claim 19, wherein the non-exposed area corresponds to a position of the power line adjacent to at least one subpixel of the red, green, blue and white subpixels, and the exposed area corresponds to a position of the signal line adjacent to the at least one subpixel.

21. The method of claim 20, wherein a size of the exposed area corresponds to or is smaller than a vertical length defining an opening of the white subpixel.

* * * * *